(12) United States Patent
Salmon

(10) Patent No.: US 11,523,543 B1
(45) Date of Patent: Dec. 6, 2022

(54) WATER COOLED SERVER

(71) Applicant: Peter C. Salmon, Mountain View, CA (US)

(72) Inventor: Peter C. Salmon, Mountain View, CA (US)

( * ) Notice: Subject to any disclaimer, the term of this patent is extended or adjusted under 35 U.S.C. 154(b) by 0 days.

(21) Appl. No.: 17/739,048

(22) Filed: May 6, 2022

Related U.S. Application Data

(63) Continuation-in-part of application No. 17/681,522, filed on Feb. 25, 2022.

(51) Int. Cl.
  *H05K 7/20* (2006.01)
  *G06F 1/20* (2006.01)

(52) U.S. Cl.
  CPC .......... *H05K 7/20772* (2013.01); *G06F 1/20* (2013.01); *G06F 2200/201* (2013.01)

(58) Field of Classification Search
  None
  See application file for complete search history.

(56) References Cited

U.S. PATENT DOCUMENTS

| | | | |
|---|---|---|---|
| 4,114,275 A | 9/1978 | Jones et al. |
| 4,124,338 A | 11/1978 | Mitchell |
| 4,169,262 A | 9/1979 | Schwartz et al. |
| 4,259,676 A | 3/1981 | Salmon |
| 4,309,365 A | 1/1982 | Van Ness et al. |
| 4,341,518 A | 7/1982 | Wallace |
| 4,366,802 A | 1/1983 | Goodine et al. |
| 4,419,300 A | 12/1983 | Van Ness et al. |
| 4,534,803 A | 8/1985 | Asano et al. |
| 4,551,787 A | 11/1985 | Mittal et al. |
| 4,585,293 A | 4/1986 | Czeschka et al. |
| 4,669,529 A | 6/1987 | Evertz |
| 4,677,528 A | 6/1987 | Miniet |
| 4,733,256 A | 3/1988 | Salmon |
| 4,765,400 A | 8/1988 | Chu et al. |
| 4,777,500 A | 10/1988 | Salmon |
| RE32,897 E | 3/1989 | Salmon |
| 4,928,207 A | 5/1990 | Chrysler et al. |
| 4,973,247 A | 11/1990 | Varnes et al. |
| 4,975,058 A | 12/1990 | Woodward |
| 4,978,548 A | 12/1990 | Cope et al. |
| 4,993,229 A | 2/1991 | Baus et al. |
| 5,028,988 A | 7/1991 | Porter et al. |
| 5,030,976 A | 7/1991 | Salmon |

(Continued)

*Primary Examiner* — Courtney L Smith
(74) *Attorney, Agent, or Firm* — Jennifer Hayes; Nixon Peabody LLP

(57) ABSTRACT

A computer module includes a substrate having redistribution layers comprising conductors and dielectrics formed on both sides of the substrate. Selected thin film conductors have a half pitch of 2 μm or less. Semiconductor components selected from bare die, chiplets, stacked devices, and low-profile packaged devices are flip chip mounted on the substrate. After grinding and polishing operations, a polished planar surface extends across each side of the substrate, coincident with the back side of the semiconductor components. Copper sheets are bonded to the polished planar surfaces using die attach films. A water-cooled server comprises multiple computer modules disposed in a tank with cooling water circulating around the modules. It dissipates 6.3 MW at a water flow rate of 339 gallons per minute and has a power density of 1 kW/in$^3$.

23 Claims, 7 Drawing Sheets

(56) References Cited

U.S. PATENT DOCUMENTS

| | | |
|---|---|---|
| 5,074,787 A | 12/1991 | Tsukada |
| 5,088,924 A | 2/1992 | Woodward |
| 5,145,370 A | 9/1992 | Woodward |
| 5,153,617 A | 10/1992 | Salmon |
| 5,155,661 A | 10/1992 | Nagesh et al. |
| 5,214,570 A | 5/1993 | Shah et al. |
| 5,283,446 A | 2/1994 | Tanisawa |
| 5,287,127 A | 2/1994 | Salmon |
| 5,323,292 A | 6/1994 | Brzezinski |
| 5,400,062 A | 3/1995 | Salmon |
| 5,465,192 A | 11/1995 | Yoshikawa |
| 5,476,572 A | 12/1995 | Prough |
| 5,478,778 A | 12/1995 | Tanisawa |
| 5,501,077 A | 3/1996 | Davis et al. |
| 5,514,906 A | 5/1996 | Love et al. |
| 5,555,579 A | 9/1996 | Wu et al. |
| 5,700,355 A | 12/1997 | Prough |
| 5,717,608 A | 2/1998 | Jensen |
| 5,778,677 A | 7/1998 | Hung et al. |
| 5,800,170 A | 9/1998 | Tsukada |
| 5,859,763 A | 1/1999 | Nam et al. |
| 5,897,610 A | 4/1999 | Jensen |
| 5,968,314 A | 10/1999 | Prough |
| 6,055,157 A | 4/2000 | Bartilson |
| 6,126,099 A | 10/2000 | Fachinger et al. |
| 6,126,883 A | 10/2000 | Troetscher et al. |
| 6,309,049 B1 | 1/2001 | Salmon |
| 6,210,262 B1 | 4/2001 | Burch et al. |
| 6,251,466 B1 | 6/2001 | McGuire et al. |
| 6,404,640 B1 | 6/2002 | Ishimine et al. |
| 6,452,789 B1 | 9/2002 | Pallotti et al. |
| 6,467,679 B2 | 10/2002 | Kyomasu et al. |
| 6,491,202 B1 | 12/2002 | Kyomasu et al. |
| 6,528,878 B1 | 3/2003 | Daikoku et al. |
| 6,601,295 B2 | 8/2003 | Maekawa |
| 6,621,707 B2 | 9/2003 | Ishimine et al. |
| 6,644,058 B2 | 11/2003 | Bash et al. |
| 6,664,627 B2 | 12/2003 | Cheon |
| 6,817,204 B2 | 11/2004 | Bash et al. |
| 6,853,554 B2 | 2/2005 | Bash et al. |
| 6,881,609 B2 | 4/2005 | Salmon |
| 6,882,533 B2 | 4/2005 | Bash et al. |
| 6,890,799 B2 | 5/2005 | Daikoku et al. |
| 6,927,471 B2 | 8/2005 | Salmon |
| 7,069,737 B2 | 7/2006 | Wang et al. |
| 7,144,792 B2 | 12/2006 | Wilmot et al. |
| 7,163,830 B2 | 1/2007 | Salmon |
| 7,240,500 B2 | 7/2007 | Bash et al. |
| 7,254,024 B2 | 8/2007 | Salmon |
| 7,297,572 B2 | 11/2007 | Salmon |
| 7,408,258 B2 | 8/2008 | Salmon |
| 7,415,289 B2 | 8/2008 | Salmon |
| 7,427,809 B2 | 9/2008 | Salmon |
| 7,455,094 B2 | 11/2008 | Lee et al. |
| 7,505,862 B2 | 3/2009 | Salmon |
| 7,535,107 B2 | 5/2009 | Salmon |
| 7,586,747 B2 | 9/2009 | Salmon |
| 7,658,614 B2 | 2/2010 | Wilmot et al. |
| 7,659,141 B2 | 2/2010 | Chung-Long-Shan et al. |
| 7,738,250 B2 | 6/2010 | Wu et al. |
| 7,787,254 B2 * | 8/2010 | Clayton .................. H05K 1/189 361/784 |
| 7,902,666 B1 | 3/2011 | Hsu et al. |
| 7,946,465 B2 | 5/2011 | Silverbrook et al. |
| 7,952,191 B2 | 5/2011 | Sunohara et al. |
| 7,988,033 B2 | 8/2011 | Chung-Long-Shan et al. |
| 8,252,635 B2 | 8/2012 | Salmon |
| 8,457,806 B2 | 6/2013 | Shah |
| 8,685,833 B2 | 4/2014 | Khanna et al. |
| 8,922,511 B1 | 12/2014 | Salmon |
| 9,059,070 B2 | 6/2015 | Salmon |
| 9,095,942 B2 | 8/2015 | Campbell |
| 9,142,533 B2 | 9/2015 | Shen et al. |
| 9,214,416 B1 | 12/2015 | Furnival |
| 9,227,220 B1 | 1/2016 | Salmon |
| 9,250,024 B2 | 2/2016 | Campbell |
| 9,257,751 B2 | 2/2016 | Felic et al. |
| 9,386,685 B2 | 7/2016 | Bonkohara |
| 9,493,102 B2 | 11/2016 | Tang et al. |
| 9,576,409 B2 | 2/2017 | Salmon |
| 9,633,771 B2 | 4/2017 | Salmon |
| 9,761,620 B1 | 9/2017 | Salmon |
| 9,773,755 B2 | 9/2017 | Shen et al. |
| 9,874,923 B1 * | 1/2018 | Brown .................. G06F 1/3234 |
| 10,039,210 B2 | 7/2018 | Wong |
| 10,212,849 B2 * | 2/2019 | Matsumoto ........ H05K 7/20272 |
| 10,249,503 B2 | 4/2019 | Yoon et al. |
| 10,336,599 B2 | 7/2019 | Miles |
| 10,461,009 B2 | 10/2019 | Hung et al. |
| 10,624,236 B2 * | 4/2020 | Inano .................. H05K 7/20236 |
| 10,910,364 B2 * | 2/2021 | Or-Bach .......... H01L 21/76254 |
| 10,966,338 B1 * | 3/2021 | Salmon .............. H05K 7/20463 |
| 11,064,626 B1 * | 7/2021 | Salmon ................ H05K 7/1487 |
| 2001/0042777 A1 | 11/2001 | Kyomasu et al. |
| 2003/0000552 A1 | 9/2003 | Bratten et al. |
| 2003/0151130 A1 | 12/2003 | Cheon |
| 2006/0244926 A1 | 4/2006 | Shih et al. |
| 2007/0176298 A1 * | 8/2007 | Osone .................. H01L 25/0657 257/E23.125 |
| 2007/0240785 A1 | 10/2007 | Lee |
| 2007/0256773 A1 | 11/2007 | Huang |
| 2009/0185343 A1 | 7/2009 | Wu |
| 2010/0275971 A1 | 11/2010 | Zingher |
| 2011/0192172 A1 | 8/2011 | Delacruz |
| 2012/0165908 A1 | 6/2012 | Kou et al. |
| 2012/0217772 A1 | 8/2012 | Tang |
| 2013/0015578 A1 | 1/2013 | Thacker |
| 2013/0228898 A1 | 9/2013 | Ide |
| 2014/0123492 A1 | 5/2014 | Campbell |
| 2015/0199858 A1 | 7/2015 | Salmon |
| 2016/0155682 A1 | 6/2016 | Ahuja et al. |
| 2017/0015477 A1 | 1/2017 | Miles |
| 2017/0254574 A1 | 1/2017 | Miles |
| 2017/0292782 A1 | 10/2017 | Joyer et al. |
| 2017/0308133 A1 | 10/2017 | Soffer |
| 2017/0354061 A1 * | 12/2017 | Saito ........................ F25D 9/00 |
| 2018/0170744 A1 | 6/2018 | Petersen et al. |
| 2018/0315730 A1 | 11/2018 | Gill et al. |
| 2018/0320937 A1 | 11/2018 | Deng et al. |
| 2019/0041104 A1 | 2/2019 | Yin |
| 2019/0041105 A1 | 2/2019 | Yin |
| 2019/0363196 A1 * | 11/2019 | Wood .................... H01L 29/083 |
| 2019/0377391 A1 | 12/2019 | Chen |
| 2020/0027809 A1 | 1/2020 | Hung et al. |
| 2020/0091111 A1 | 3/2020 | Lee et al. |
| 2020/0243429 A1 | 7/2020 | Lai et al. |
| 2020/0328139 A1 * | 10/2020 | Chiu .................... H01L 23/473 |

* cited by examiner

WATER COOLED SERVER

PRIORITY CLAIM

The present application is a continuation-in-part application of U.S. Pat. No. 17,681,522, entitled "Water Cooled Server," filed on Feb. 25, 2022, the entirety of which is hereby incorporated by reference.

TECHNICAL FIELD

This invention relates to the field of water-cooled electronics and to water-cooled servers in particular.

BACKGROUND

Rack mounted servers employ processors and supporting devices mounted on printed circuit boards. High-power chips mounted on the printed circuit boards are typically sold as packaged devices that require large heat sinks. The packaged devices and the heat sinks occupy considerably more space than the original die contained within the packages.

FIG. 45 of U.S. Patent Pub. No. US 2021/0343690, the entirety of which is hereby incorporated by reference, illustrates a computer system comprising multiple laminate blocks partially immersed in a cooling liquid inside of a tank. Extruded copper elements having cooling fins are shown. The laminate block comprises a two-sided laminate assembly and a single-sided laminate assembly.

FIG. 36 of U.S. Patent Pub. No. US 2021/0343690, the entirety of which is hereby incorporated by reference, is a block diagram of a computer system comprising multiple circuit assemblies, each circuit assembly comprising independently operable clusters of components, also known as tiles. The use of redundancy is described, including switchable components and redundant switchable components. A power distribution device is shown, operable to power up or power down switchable components as commanded by a system controller. A test/monitor chip in each circuit assembly detects component failures by monitoring bus activity during operation.

SUMMARY

Embodiments of the invention are directed to server configurations having increased power density and improved manufacturability.

In accordance with a first aspect of the invention, a computer module includes a substrate with redistribution layers on a first side and on a second side. The redistribution layers include thin film conductors and thin film dielectrics, and selected thin film conductors have a half-pitch of 2 μm or less. Electronic components are flip chip mounted on the substrate at connection points provided by the thin film conductors. Spaces between the components may be filled with a filler material. After back-grinding and polishing operations a polished planar surface extends across each side of the substrate, the planar surface coincident with the back side of the flip chip mounted components. Copper sheets are bonded to the polished planar surfaces on each side of the substrate using a thermal interface material (TIM). The TIM may be a die attach film, or a composite of multiple layers and may have a thickness in the range of 1-50 μm. Copper plates are soldered to each of the copper sheets to form a sealed enclosure that is impervious to water except for an opening at the top for making input/output connections. For protection against water intrusion a gasket and a matching backing plate are provided at the opening of the sealed enclosure. A portion of the substrate protudes through the opening at the top of the sealed enclosure for connecting to the motherboard using a connector or a socket attached to the substrate or to the motherboard, this portion of the substrate including thin film conductors and no mounted components; terminals of the connector connect with selected ones of the thin film conductors on the substrate. The electronic components may be selected from bare die, chiplets, stacked devices, and low-profile packaged devices. Stacked devices may include a chiplet, an interposer or a bridge device. The flip chip components on the first side of the substrate may be mounted in a mirror image of the flip chip components mounted on the second side of the substrate. The electronic components mounted on the substrate may be organized in tiles arrayed on each side of the substrate. Each tile may be operable as an independently operable cluster of components. Each tile may include at least one processor, at least one memory device, at least one communication device and at least one sensor. Each tile may include redundant components for replacing failed or failing components. Each tile may further include a test/monitor chip for monitoring bus activity to determine failed or failing components. Each tile may also include a power distribution device which may be used to power up or power down selected components. Each tile may be networked with one or more neighboring tiles. Each tile may be operable at an average power level in the range of 200-500 watts per square inch on each side of the substrate.

In accordance with a second aspect of the invention a water-cooled server may include multiple computer modules that are operable when partially immersed in a tank of water. Each module may be configured similarly and operate similarly to computer modules as described above in accordance with the first aspect of the invention. The water-cooled server may include separators between the computer modules, and each separator may comprise a wire structure such as a wire frame. The water-cooled server may include a motherboard having a socket or connector for connecting each computer module to the motherboard.

In accordance with a third aspect of the invention, a method for manufacturing and deploying a water-cooled server may include: fabricating computer modules that are operable while partially immersed in water, each computer module comprising a sealed copper enclosure having an opening at the top for making input/output connections; providing inside each module enclosure a substrate having attached electronic components; arranging the electronic components in tiles, the tiles extending across each side of each substrate; arraying the computer modules inside a tank with separators between them; coupling signals and power that comprise the input/output connections on each computer module to corresponding terminals on a motherboard; coupling signals and power on the motherboard to external signals and power using front or rear panel connectors; circulating cooling water between the modules at a velocity in the range of 3-24 inches per second; and, operating the water-cooled server at a power density in the range of 500-1500 watts per cubic inch of tank volume. The method may also include: providing redundant components in each tile; providing a test/monitor chip and a power distribution device in each tile; monitoring the health of selected components in each tile using the test/monitor chip and replacing failed or failing components with redundant components using the power distribution device, under command of a system controller; adapting to changing workloads using agile reconfiguration by employing the power distribution devices to invoke different sets of tiles to execute different workloads as required; and, providing lifecycle support by replacing failed or failing electronic components with redundant electronic components as required to maintain a predetermined system specification.

BRIEF DESCRIPTION OF THE DRAWINGS

The accompanying drawings, which are incorporated into and constitute a part of this specification, illustrate prior art and examples of embodiments. The examples of embodiments, together with the description of example embodiments, explain the principles and implementations of the embodiments.

DETAILED DESCRIPTION

Figure 1:
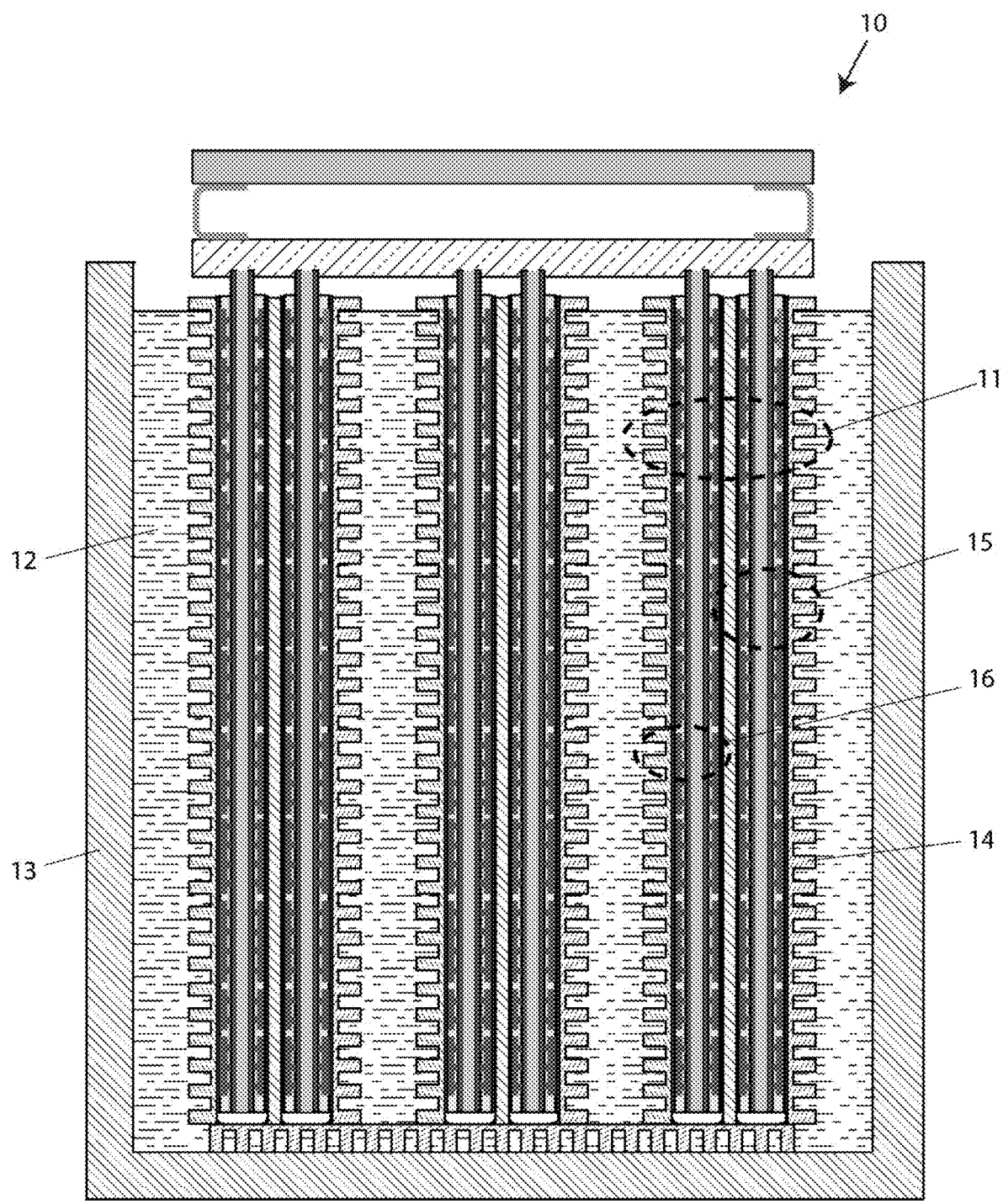
FIG. 1 illustrates a prior art computer system comprising multiple laminate blocks partially immersed in a cooling liquid inside a tank.

FIG. 1 (Prior Art) illustrates a computer system 10 comprising multiple laminate blocks 11 partially immersed in a cooling liquid 12 inside of a tank 13. Extruded copper elements 14 having cooling fins are shown. A laminate block 11 comprises a two-sided laminate assembly 15 having copper elements on two sides, and a single-sided laminate assembly 16 having a copper element on one side.

Figure 2:
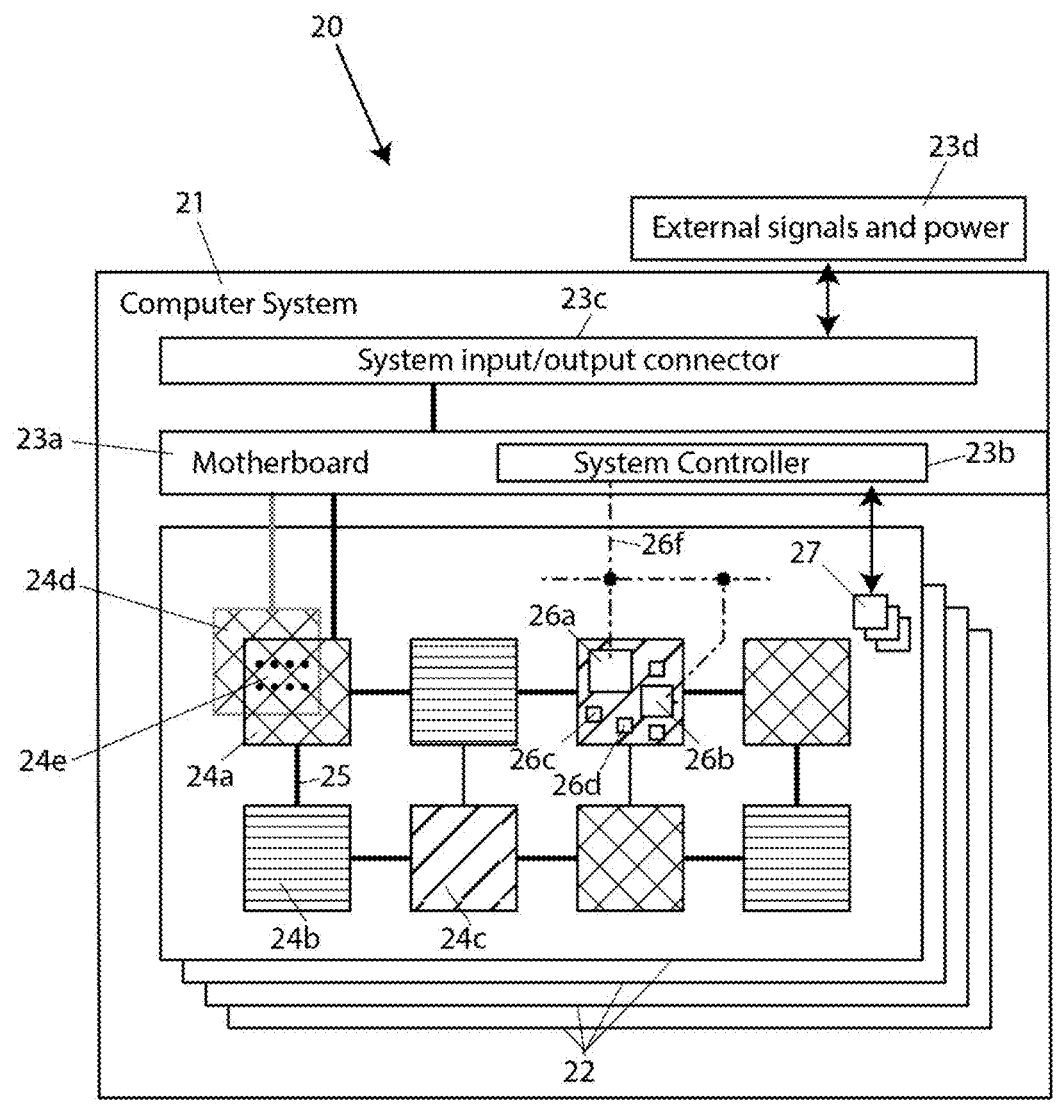
FIG. 2 is a block diagram of a prior art computer system having multiple substrates and independently operable clusters of components implemented as tiles arrayed across each side of each substrate.

FIG. 2 (Prior Art) is a block diagram 20 of a computer system 21 having independently operable clusters of components implemented as tiles such as 24a, 24b, 24c, 24d, arrayed across each side of each substrate 22 in the computer system. Computer system 21 includes a motherboard 23a, a system controller 23b, and a system input/output connector 23c that is connected to external signals and power 23d. Sensors 27 that communicate with the system controller 23b are also shown. System controller 23b may communicate with each tile using a serial control bus 26f that connects with a test/monitor chip 26a and a power distribution device 26b. Switchable components 26c and redundant switchable components 26d may be powered up or powered down by power distribution device 26b, under command of the system controller 23b.

Embodiments of the present invention are directed towards tiles, including the following tile embodiments. Each tile may be operable as an independently operable cluster of components. Each tile may include at least one processor, at least one memory device, at least one communication device, and at least one sensor. Each tile preferably includes redundant components, a test/monitor chip, and a power distribution device. Redundant components are provided for each mounted component that could fail. All originally-mounted components that could fail as well as redundant components are switchable between a powered-up state and a powered-down state using the power distribution device, under command of a system controller. The system controller is connected to all yield-related mounted components via a serial bus and maintains a status for all such components. The powered-down state may be a zero-power state or a low-power state. Transitions between powered-down and powered-up states are preferably slow-ramp transitions to avoid injecting noise during the transitions. The test/monitor chip is coupled to system buses and monitors the activity on the system buses to determine if a mounted device has failed or is starting to fail. Information is shared between temperature sensors and the test/monitor chip and the system controller because imminent failure may be signaled by a localized increase in temperature. Each tile is networked with one or more neighbors for sharing information and for system recovery by powering down failed tiles that are not recoverable using redundancy, while maintaining system connectivity between surviving tiles.

Embodiments of the invention are also directed to agile reconfiguration. In one embodiment, agile reconfiguration is directed to the ability to apply redundancy to recover from faults, and to provide workload adaptation, and to provide graceful reconfiguration rather than degradation over a life cycle.

Embodiments of the invention are also directed to a water-cooled server. The water cooled server includes a plurality of computer modules operable when partially immersed in a tank of water, wherein each computer module comprises: a substrate; redistribution layers comprising thin film conductors and thin film dielectrics formed on a first side and a second side of the substrate, wherein selected thin film conductors have a half-pitch of 2 µm or less; a plurality of electronic components flip-chip mounted on the substrate at connection points provided by the thin film conductors; a filler material disposed in spaces between the flip-chip mounted components; a polished planar surface at the backside of the flip-chip mounted components at each of the first side and the second side of the substrate; a first metal sheet on the first side and a second metal sheet on the second side of the substrate, each metal sheet bonded to a corresponding polished planar surface using a thermal interface material; and, metal plates attached to the first metal sheet and the second metal sheet to form a sealed enclosure that is impervious to water except for an opening at the top for making input/output connections.

Figure 3:
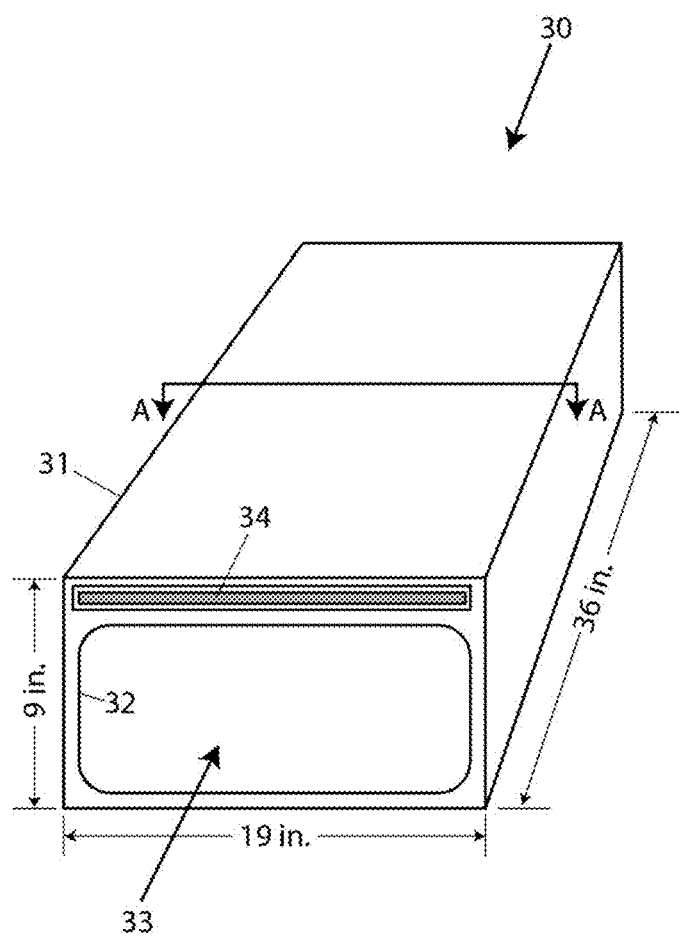
FIG. 3 is a perspective external view of a water-cooled server in accordance with an embodiment of the present disclosure.

FIG. 3 illustrates a water-cooled server 30 in accordance with an embodiment of the present disclosure. Server 30 includes a tank 31, an inlet 32 for cooling water 33, and an input/output connector 34. Cooling fluids other than water may be used; for example, ethylene glycol may be used in some environments; dielectric fluids may be used in other environments. Other dimensions may be used; the dimensions shown are convenient for lifting by a service person after water has been drained from the tank. Multiple input/output connectors 34 may be used; for example, a connector may comprise coupling of a fiber-optic cable for high-speed communications between servers; power connectors may be larger in size. A water inlet structure having an opening 32 may be shaped to accommodate input/output connectors, and a water outlet structure (not shown) may similarly be shaped to accommodate input/output connectors at a rear panel.

In one embodiment, the dimensions of the water-cooled server 30 are a width of 19 inches, a height of 9 inches and a length of 36 inches. It will be appreciated that these dimensions are exemplary and that the actual dimensions may vary from those shown in FIG. 3.

Figure 4:
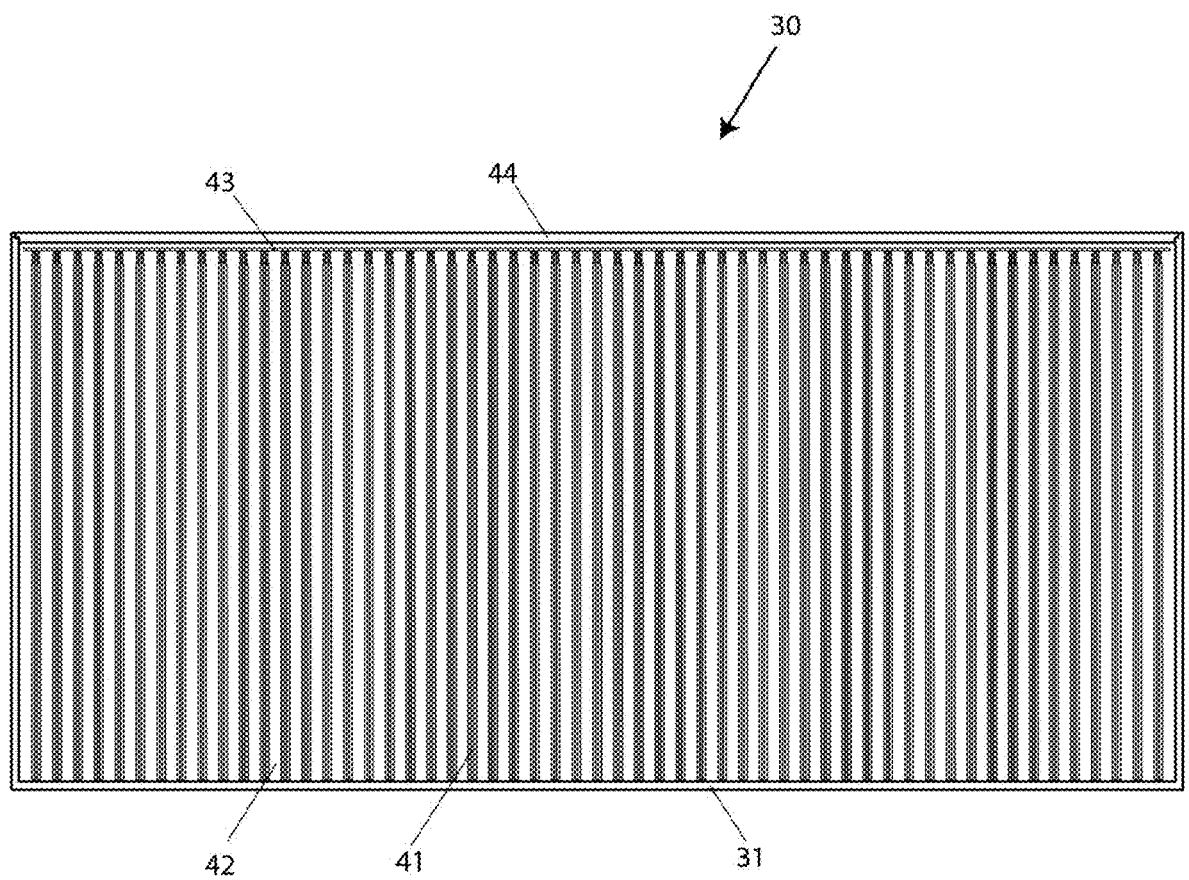
FIG. 4 illustrates a cross-sectional view corresponding to section AA of FIG. 3 in accordance with an embodiment of the present disclosure.

FIG. 4 illustrates in cross-section water-cooled server 30 through line A-A in FIG. 3. As shown in FIG. 4, multiple computer modules 41 are immersed in cooling water 42, inside of a tank 31. Each computer module 41 is coupled to a motherboard 43 using for example a socketed connection. A lid 44 of tank 31 is shown. The labeled elements in FIG. 4 are shown approximately to scale, to indicate their relative size. However, different shapes, scales, and dimensions are covered by the present disclosure. Tank 31 may comprise stainless steel or any other metal; to mitigate potential chemical interactions between dissimilar metals, tank 31 may comprise brass for example.

Figure 5:
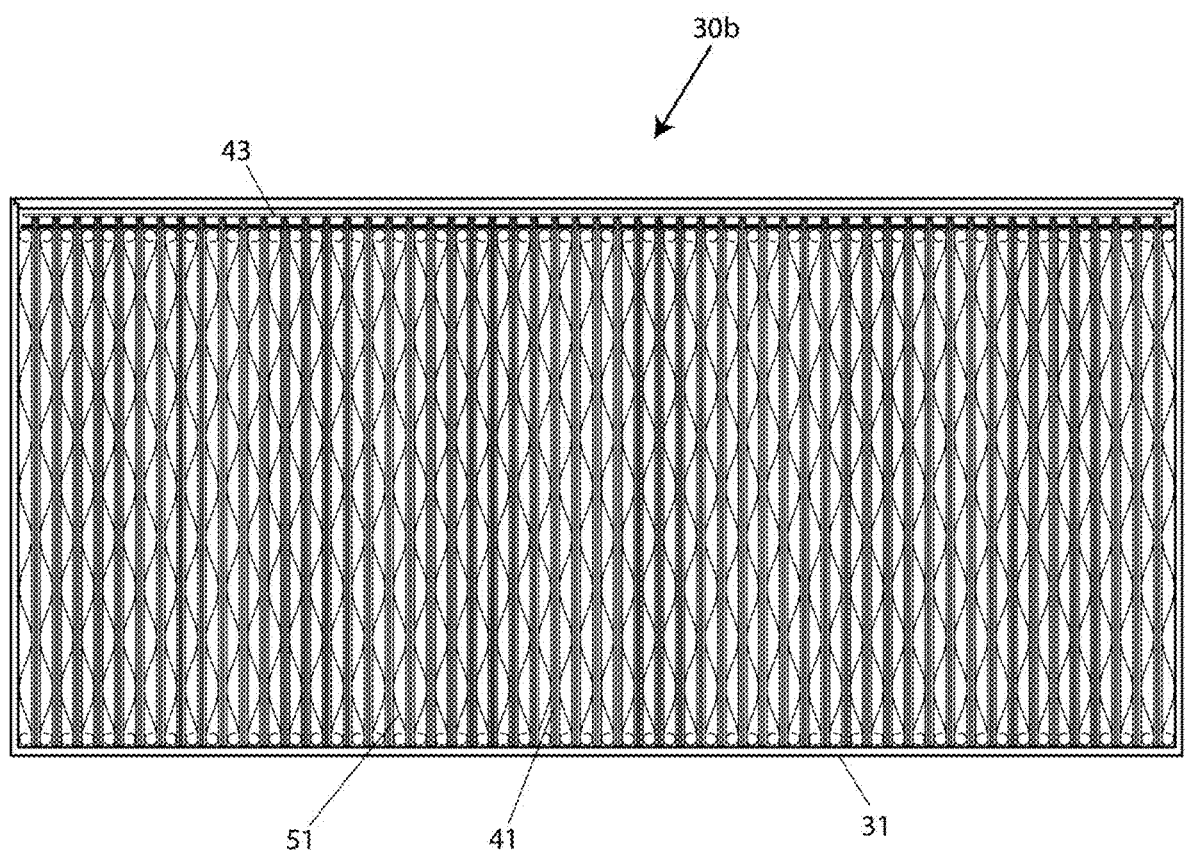
FIG. 5 is a second cross-sectional view of the water-cooled server of FIG. 3, wherein separators are included between the computer modules in accordance with an embodiment of the present disclosure.

FIG. 5 illustrates the use of separators 51 between computer modules 41 in a water-cooled server 30b. Consistent spacing of the computer modules may be desirable for uniform cooling. Separators 51 may comprise a wire structure such as a wire frame, chosen to create minimal impediment to water flow. For example, the wire of a wire frame separator may have a diameter of around, for example, 0.5 mm, which is much smaller than an exemplary spacing between modules of 5 mm. A manufacturing sequence may comprise alternating placements of computer modules 41 and separators 51 into tank 31. When the computer modules and separators are well positioned, matching sockets in motherboard 43 conveniently engage with computer modules 41. In one embodiment, computer modules and separators may be varied in size within tank 31 to accommodate different tiles for different purposes, where the power requirements may vary. For example, a first substrate may comprise CPU-intensive tiles that dissipate more power than a second substrate comprising memory-intensive or sensor-intensive tiles; the separators adjacent corresponding computer modules may be width-adjusted to implement a wider spacing and a greater water flow adjacent the higher-power computer modules containing the higher-powered substrates. A further example is a computer server that is adaptable to perform (i) inference, (ii) analysis, and (iii) training in a machine learning application, wherein for each different configuration a system controller may invoke different substrates having different levels of power dissipation.

Figure 6:
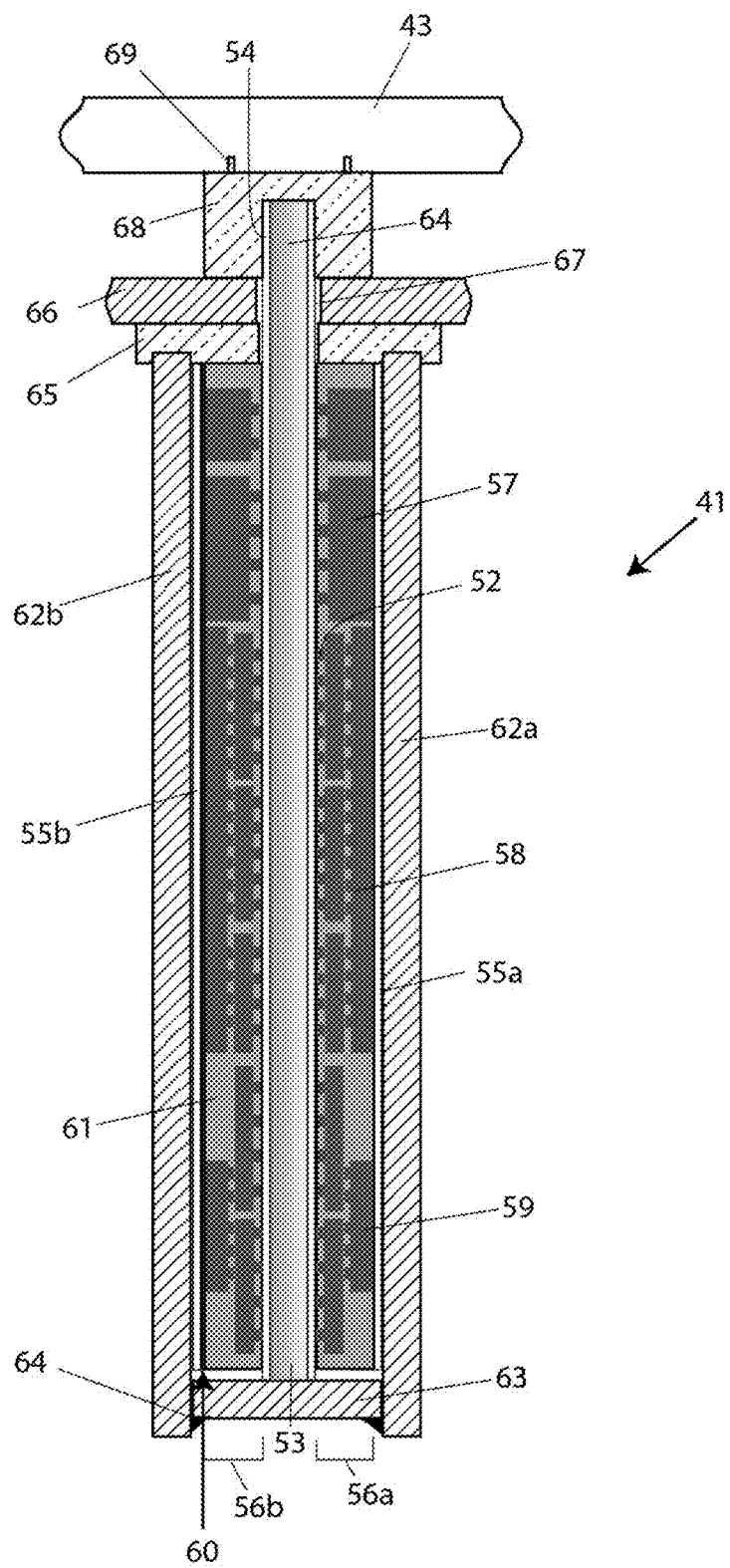
FIG. 6 is an expanded cross-sectional view of a computer module in accordance with an embodiment of the present disclosure.

FIG. 6 illustrates a computer module 41 in accordance with an embodiment of the present disclosure. An expanded scale is used to reveal details such as redistribution layers 54 and sheets of thermal interface material 55a, 55b, each of which may be only a few micrometers thick. The redistribution layers 54 include thin film conductors and thin film dielectrics fabricated on substrate 53. Possible substrate materials include glass, as used in flat panel displays (FPDs), or an organic substrate augmented with finely patterned redistribution layers (RDLs). The latter arrangement may be described as "fan-out on substrate". Selected thin film conductors on substrate 53 have a half-pitch of 2 μm or less to accommodate attachment of modern devices such as high bandwidth memories (HBMs) which have dense input/output configurations for attaching to a substrate. To achieve this half-pitch resolution, advanced lithography systems may be used; an example is a CANON MPAsp-E903T which is a wide-field lithographic system capable of resolving 1.2 μm line and space features across Gen6 glass panels that measure 1500×1850 mm. A second example is maskless imaging by EV GROUP, achieving 2 μm line and space resolution without a substrate size limitation.

FIG. 6 also illustrates circuit assemblies 56a and 56b that each comprise attachments of flip chip components to substrate 53. To minimize potential warpage issues, it may be desirable to create circuit assembly 56b as a mirror image of circuit assembly 56a. Circuit assembly 56a is shown with semiconductor components such as a bare die or chiplet 57, a stacked device comprising an interposer 58, or a stacked device comprising a bridge device 59. Arrow 60 indicates a polished planar surface for the use of thin thermal interface materials (TIMs) 55a, 55b, which is further beneficial to cooling performance. In an embodiment TIM 55a may comprise die attach film ESP7660-HK-DAF from AI TECHNOLOGY which is available in a thickness range of 10-40 μm. A thickness range of 1-50 μm may be used for TIM 55a. Other materials may be used, including layered films and composites of layered films.

FIG. 6 also illustrates filler material 61 disposed between the semiconductor elements. In accordance with a preferred embodiment, filler material 61 provides mechanical support during back-grinding and polishing operations, thereby enhancing the achievable surface properties (such as surface smoothness) at the polished planar surface shown at arrow 60. Filler material 61 may comprise a molding compound such as epoxy molding compound (EMC).

The electronic components inside a computer module 41 may be damaged by exposure to water. In forming a sealed enclosure, copper sheets or other metal members are impervious to water. Some protection against water intrusion is provided by the filler material 61. Further protection is provided by gasket 65, as described further herein.

FIG. 6 also illustrates copper sheets 62a and 62b that are bonded to circuit assemblies 56a and 56b using TIMs 55a, 55b. A copper base plate 63 and copper end plates (not shown) are attached to copper sheets 62a and 62b using solder 64 to achieve a sealed enclosure that prevents water intrusion into computer module 41, for the portion of module 41 to be immersed in water. Copper sheets 62a and 62b and copper base plate 63 may comprise another material such as brass which has slightly less desirable thermal conductivity but may be easier to polish to the desired surface roughness for mating with a microscopically thin TIM.

FIG. 6 also illustrates a protrusion 64 of substrate 53 protruding through gasket 65 and a matching backing plate 66. The backing plate 66 compresses the gasket 65 against edges of the copper sheets 62a, 62b, to provide a water seal. Gasket 65 may comprise neoprene rubber, silicone rubber, EPDM rubber, or blends of these materials to provide a compliant material and an effective water seal. Backing plate 66 may comprise stainless steel for example and includes a slot 67 for substrate 53 to pass through. Protrusion 64 comprises a portion of the substrate having thin film conductors and no mounted components; it may be described as an "edge connector". The thin film conductors are available for contacting corresponding terminals of a socket or connector 68 that may attach via pins 69 to motherboard 43 as shown. To prevent shorting of thin film conductors with a conductive backing plate 66, an insulating material (not shown) may be interposed between them. A non-conductive material such as an alumina ceramic may also be used for the backing plate 66. Motherboard 43 may comprise a conventional glass-epoxy substrate. Alternatively, a different version of connector 68 may be attached to computer module 41 at protrusion 64. Since water-cooled server 30 is 36 inches long in the example shown in FIG. 3, there is ample space available to use multiple connectors 68 along the length of substrate 53, as may be required for large numbers of input/output connections. Copper sheets 62a and 62b, together with copper base plate 63 and end-plates (not shown) comprise a sealed copper enclosure with an opening at the top, preventing water intrusion into circuit assemblies 56a and 56b. The opening at the top may be described as an input/output port. Water seepage could damage electronic components such as 57, 58, and 59. Some protection is provided by filler 61. The combination of gasket 65 and backing plate 66 provides further protection against seepage of water into circuit assemblies 56a and 56b, in accordance with an embodiment of the present disclosure.

Figure 7:
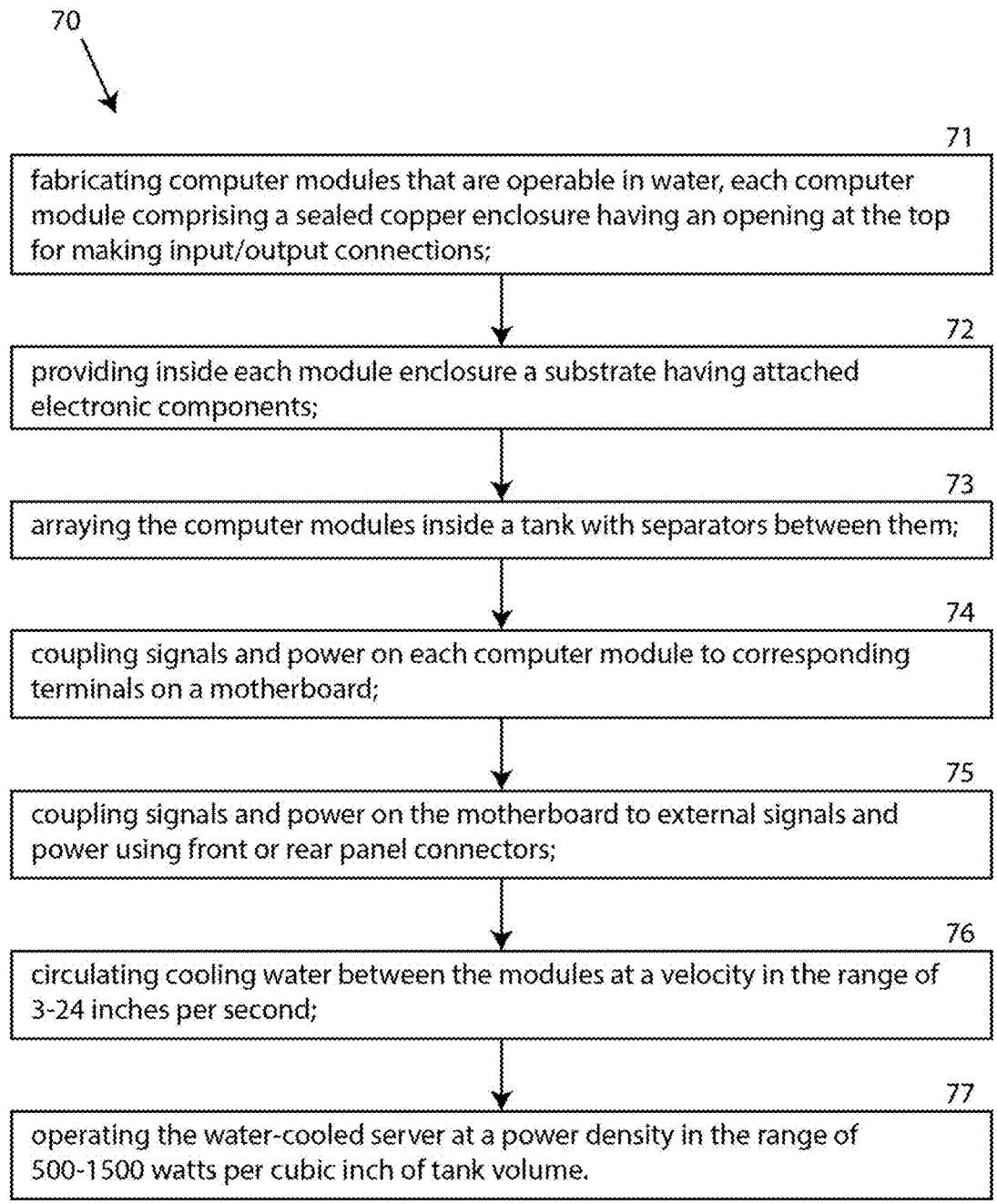
FIG. 7 is flow chart of a method for manufacturing and deploying a water-cooled server in an embodiment of the present disclosure.

FIG. 7 is a flow chart illustrating a method for manufacturing and deploying a water-cooled server 70 in accordance with an embodiment of the present disclosure. As shown in FIG. 7, the method includes fabricating computer modules that are operable in water, each computer module comprising a sealed copper enclosure having an opening at the top for making input/output connections (71); providing inside each module enclosure a substrate having attached electronic components (72); arraying the computer modules inside a tank with separators between them (73); coupling signals and power on each computer module to corresponding terminals on a motherboard (74); coupling signals and power on the motherboard to external signals and power using front or rear panel connectors (75); circulating cooling water between the modules at a velocity in the range of 3-24 inches per second (76); operating the water-cooled server at a power density in the range of 500-1500 watts per cubic inch of tank volume (77). It will be appreciated that the method 70 may include fewer or additional steps than those illustrated in FIG. 7. It will be appreciated that some of the steps may be performed simultaneously and some of the steps may be performed in a different order.

The method may also include one or more of arranging the electronic components in tiles that extend across each side of the substrate; providing redundant components in each tile; providing a test/monitor chip and a power distribution device in each tile; monitoring the health of selected components in each tile using the test/monitor chip and replacing failed or failing components with redundant components using the power distribution device, under command of a system controller; adapting to changing workloads using agile reconfiguration by employing the power distribution devices to invoke different sets of tiles to execute different workloads as required; and, providing lifecycle support by replacing failed or failing electronic components with redundant electronic components as required to maintain a predetermined system specification.

In accordance with another aspect of the present disclosure, a method for manufacturing a computer module may include providing a substrate; fabricating redistribution layers having a half-pitch resolution or 2 μm or less on a first side and a second side of the substrate; mounting a plurality of flip-chip components on each of the first side and the second side of the substrate; disposing a filler material between the plurality of flip-chip components on each of the first and the second sides of the substrate; back-grinding and polishing to create a polished planar surface extending across the substrate at the backside of the flip-chip mounted components on each of the first and the second sides of the substrate; bonding a first metal sheet to the polished planar surface on the first side of the substrate and bonding a second metal sheet to the polished planar surface on the second side of the substrate; and, attaching metal plates to the first metal sheet and the second metal sheet to form a sealed enclosure that is impervious to water except for an opening at a top side of each computer module for making input/output connections.

The attachment of semiconductor components to substrate 53 in FIG. 6 may comprise different types of terminals such as solder-tipped copper pillar bumps 52, having a simplified representation shown in FIG. 6, or hybrid bonds. Hybrid bonds comprise embedded copper pads that connect in a mating process without any visible bumps and are capable of higher input/output density than bumped connections. Other forms of bumps/attachments may be used.

Embodiments of the water-cooled server described herein can achieve an average power density of around 1 kilowatt per cubic inch of server tank volume, as will be further described. For comparison, the 4-GPU IBM Power AC922 server model 8335GTW has dimensions 17.4×3.4×33.3 inches. It is water cooled using cooling tubes with a flow rate of around 1 gallon per minute and has a maximum power consumption of 2,300 W. The maximum power density is 2,300/1,970=1.2 watts per cubic inch. The difference in power density between this recent state-of-the-art server and the water-cooled server 30 illustrates the utility of the proposed computer architecture. A compaction factor for electronic systems is closely related to power density. Assuming the same chips are used, the total power dissipation will be the same and the volume will be inversely proportional to power density. Accordingly, a compaction factor approaching 800× may be achievable for a computer system having the architecture described herein compared with a conventional system employing glass-epoxy printed circuit boards with assorted electronic packages and assemblies mounted thereon, including heat sinks where necessary. Thus, variations of embodiments described herein may be advantageously applied to electronic systems where space is at a premium or aggressive cooling is required.

The following calculations are provided in support of the power density claims; they relate to FIGS. 3-6 for water-cooled server 30. An average power density of 0.31 W/mm$^2$ is assumed for semiconductor components attached to substrate 53 of FIG. 6. This average power density is consistent with a tile area of 2000 mm$^2$ having the following mounted components: an EPYC chip measuring 28×36 mm having a power dissipation of 271 watts; a VEGA 10 GPU measuring 22×22 mm having a power dissipation of 300 watts, and an assortment of lower powered chips having an area of 500 mm$^2$ and a combined power dissipation of 50 watts. An interconnection street having a width of 1 mm is provided around each component. On each side of substrate 53 an area of 212×864 mm is provided, with one inch at each end of water-cooled server 30 reserved for input/output connectors. Including two sides, the total substrate area available for component mounting is 366,336 mm$^2$ or 568 in$^2$. Thus, the total power per substrate 53 (and the total power per computer module 41) is 366,336 mm$^2$×0.31W/mm$^2$=114 kW. Water-cooled server 30 comprises 55 computer modules 41 as shown in FIG. 4. Thus, the total power for water-cooled server 30 is 55×114 kW or 6.3MW. The total volume of server 30 is 9×19×36 inches or 6,156 in$^3$. The power density per cubic inch of server volume is 6.3MW/6,156 in$^3$=1 kW/in$^3$.

The junction temperature of a high-powered device mounted on a substrate 53 in a computer module 41 will now be calculated. In an embodiment the TIM material 55a is die attach film ESP7660-HK-DAF from AI TECHNOLOGY. The high-power chip under consideration is the VEGA 10

GPU measuring 22×22 mm and having a power dissipation of 300 watts. The cross-sectional area available for water flow along the length of water-cooled server 30 is 5 mm×215 mm×56=60,200 mm² or 93.3 in² from FIG. 4. In an embodiment the water has an average flow velocity of 14 inches per second leading to a water flow rate of 1,306 in³/sec or 5.65 gallons per second or 339 gallons per minute (gpm). A different flow velocity may be used. For example, a flow velocity of 3-24 inches per second may be used in embodiments of the present disclosure. A different water flow rate may be used. For example, a flow rate of 200-500 gpm may be employed in embodiments of the present disclosure. The mass flow rate equation may be used: $\Delta T = q/(m_{dot} * C_p)$, where $\Delta T$ is the temperature rise in degrees Centigrade, q is the dissipated power in watts, $M_{dot}$ is the mass flow rate in grams per sec, and $C_p$ is the specific heat of water (4.186 J/gm° C.). This results in a $\Delta T$ of 70° C. which means that the water temperature at the outlet will be 70° C. warmer than at the inlet when water-cooled server 30 is dissipating 6.3MW of heat. The heat path starting at the VEGA 10 GPU chip, passing through the TIM and the copper sheet to reach the cooling water will add an additional $\Delta T$ of 2° C. as shown in Table 1 below. A is the area of an element in the heat path, t is the corresponding thickness, P is the power flowing through the element, 6th is the thermal conductivity, $\theta$ is the thermal resistance, and $\Delta T$ is the temperature difference across the element.

TABLE 1

| Part | A mm² | t mm | P W | $\sigma_{th}$ W/m° C. | $\theta$ ° C./W | $\Delta T$ ° C. |
|---|---|---|---|---|---|---|
| VEGA 10 GPU | 484 | 1 | 300 | 149 | 0.00325 | 0.974 |
| die attach film | 484 | 0.01 | 300 | 1.8 | 0.00269 | 0.807 |
| copper sheet | 529 | 0.5 | 300 | 390 | 0.00068 | 0.203 |
| | | | | | Total $\Delta T$ | 1.985 |

Assuming a water inlet temperature of 40° C. a junction temperature of 112° C. is achievable (40+70+2); this is for one of the highest-powered chips that may be used. This attractive result is a consequence of providing a cooling path with low thermal resistance from chip to cooling water. No customized heat sink is required over and above the standardized thermal architecture that is provided for all chips mounted in a computer module 41. The tight thermal coupling of semiconductor components to cooling water also means that hot spots on a die will be less problematic. Table 1 also shows that the temperature drop across the copper sheet is minimal, so the use of brass or another metal instead of copper will have little significance if improved mechanical properties become important. Since reliability is increased for cooler electronic systems, systems employing similar cooling embodiments will tend to have higher reliability than other systems that may allow the junction temperature to rise to around 150° C. for example.

The example of the VEGA 10 being satisfactorily cooled provides an estimate of areal power density in embodiments of the present disclosure. This chip dissipates 300 W over an area of 23×23 mm, assuming a border of 1 mm around mounted components. This converts to an areal power density of 366 W/in². Accordingly, embodiments of the present disclosure may support an areal power density in the range 200-500W/in².

There is a limit to heat transfer across a copper-to-water interface; it can be calculated using a convective heat transfer coefficient. This coefficient varies with water velocity as well as surface roughness, viscosity, and other complex factors. Accordingly, adjustments to the thermal design may be required when the coefficient becomes known for a particular set of materials and a particular operating scenario.

Manufacturability of computer modules and water-cooled servers described herein is enhanced by the fact that the electronic structures are regularized. Greater automation is achievable because of the regularized structures. For example, die-level components may be assembled onto a large substrate using a single pass of a precision pick and place machine, as opposed to a mix of manual and automated placements of packaged parts, daughter boards, isolating enclosures, and heat sinks. Similarly, the thermal environment of embodiments described herein provides such strong cooling for all components in a computer module that many conventional rules relating to thermal design may become unnecessary.

As will be understood by those familiar with the art, the invention may be embodied in other specific forms without departing from the spirit or essential characteristics thereof. Likewise, the particular naming and division of the members, features, attributes, and other aspects are not mandatory or significant, and the mechanisms that implement the invention or its features may have different structural construct, names, and divisions. Accordingly, the disclosure of the invention is intended to be illustrative, but not limiting, of the scope of the invention.

While the invention has been described in terms of several embodiments, those of ordinary skill in the art will recognize that the invention is not limited to the embodiments described but can be practiced with modification and alteration within the spirit and scope of the appended claims. Another embodiment may comprise a computer module having a greater or lesser number of substrate mounting surfaces for example. Other embodiments may have different overall sizes and form factors for the computer module 41 and the water-cooled server 30. The description is thus to be regarded as illustrative instead of limiting. There are numerous other variations to different aspects of the invention described above, which in the interest of conciseness have not been provided in detail. Accordingly, other embodiments are within the scope of the claims.

The invention has been described in relation to particular examples, which are intended in all respects to be illustrative rather than restrictive. Those skilled in the art will appreciate that many different combinations will be suitable for practicing the present invention. For example, the teachings may be applied to other water-cooled electronic systems, especially those with space limitations or aggressive cooling requirements. Other implementations of the invention will be apparent to those skilled in the art from consideration of the specification and practice of the invention disclosed herein. Various aspects and/or components of the described embodiments may be used singly or in any combination. It is intended that the specification and examples be considered as exemplary only, with a true scope and spirit of the invention being indicated by the following claims.

What is claimed is:
1. A computer module comprising:
   a substrate;
   redistribution layers comprising thin film conductors and thin film dielectrics formed on a first side and a second side of the substrate, wherein selected thin film conductors have a half-pitch of 2 μm or less;

a plurality of electronic components flip-chip mounted on the substrate at connection points provided by the thin film conductors;

a filler material disposed in spaces between the flip-chip mounted components;

a polished planar surface extending across the substrate at the backside of the flip-chip mounted components on the first side and on the second side of the substrate;

a first metal sheet on the first side and a second metal sheet on the second side of the substrate, each metal sheet bonded to a corresponding polished planar surface using a thermal interface material; and, metal plates attached to the first metal sheet and the second metal sheet to form a sealed enclosure that is impervious to water except for an opening at the top for making input/output connections.

2. The computer module of claim 1 further comprising a gasket and backing plate disposed at the opening at the top.

3. The computer module of claim 2 wherein a portion of the substrate having thin film conductors and no mounted components protrudes through the splash guard.

4. The computer module of claim 1, wherein the plurality of electronic components are selected from bare die, chiplets, stacked devices, and low-profile packaged devices.

5. The computer module of claim 4, wherein the selected stacked devices comprise a chiplet, an interposer, or a bridge device.

6. The computer module of claim 2 further comprising a connector attached to the substrate where it protrudes through the splash guard, with terminals of the connector connected to selected thin film conductors.

7. The computer module of claim 1 wherein the flip chip components mounted at the second side of the substrate are mirror-imaged in relation to the flip chip components mounted at the first side of the substrate.

8. The computer module of claim 1 wherein the thermal interface material comprises a die attach film.

9. The computer module of claim 1 wherein the thermal interface material comprises one or more layers of material having a total thickness in the range of 1-50 μm.

10. The computer module of claim 1 wherein the attachment of the metal plates to each of the first metal sheet and the second metal sheet comprises solder.

11. The computer module of claim 1 wherein the plurality of electronic components mounted on the substrate are organized in tiles arrayed on each side of the substrate.

12. The computer module of claim 11 wherein each tile is operable as an independently operable cluster of components.

13. The computer module of claim 11 wherein each tile includes at least one processor, at least one memory device, at least one communication device, and at least one sensor.

14. The computer module of claim 11 wherein each tile includes redundant components, a test/monitor chip, and a power distribution device.

15. The computer module of claim 11 wherein each tile is networked with one or more neighboring tiles on each side of the substrate.

16. The computer module of claim 11 wherein each module is operable at a power level in the range of 200-500 watts per square inch on each side of the substrate.

17. A water-cooled server comprising:

a plurality of computer modules operable when partially immersed in a tank of water, wherein each computer module comprises:

a substrate;

redistribution layers comprising thin film conductors and thin film dielectrics formed on a first side and a second side of the substrate, wherein selected thin film conductors have a half-pitch of 2 μm or less;

a plurality of electronic components flip-chip mounted on the substrate at connection points provided by the thin film conductors;

a filler material disposed in spaces between the flip-chip mounted components;

a polished planar surface at the backside of the flip-chip mounted components at each of the first side and the second side of the substrate;

a first metal sheet on the first side and a second metal sheet on the second side of the substrate, each metal sheet bonded to a corresponding polished planar surface using a thermal interface material; and, metal plates attached to the first metal sheet and the second metal sheet to form a sealed enclosure that is impervious to water except for an opening at the top for making input/output connections.

18. The water-cooled server of claim 17 further comprising separators disposed between the modules.

19. The water-cooled server of claim 18 wherein the separators comprise wire structures.

20. The water-cooled server of claim 17 further comprising a motherboard including a socket for connecting each computer module to the motherboard.

21. A method for manufacturing and deploying a water-cooled server comprising:

fabricating computer modules that are operable when partially immersed in water, each computer module comprising a sealed copper enclosure except for an opening at the top for making input/output connections;

providing a substrate having attached electronic components inside each enclosure;

arraying the computer modules inside a tank with separators between them;

coupling signals and power on each computer module to corresponding terminals on a motherboard;

coupling signals and power on the motherboard to external signals and power using front or rear panel connectors;

circulating the cooling water between the modules at a velocity in the range of 3-24 inches per second; and, operating the water-cooled server at a power density in the range of 500-1500 watts per cubic inch of tank volume.

22. The method of claim 21 further comprising:

providing redundant components in each tile;

providing a test/monitor chip and a power distribution device in each tile;

monitoring the health of selected components in each tile using the test/monitor chip and replacing failed or failing components with redundant components using the power distribution device, under command of a system controller;

adapting to changing workloads using agile reconfiguration by employing the power distribution devices to invoke different sets of tiles to execute different workloads as required; and, providing lifecycle support by replacing failed or failing electronic components with redundant electronic components as required to maintain a predetermined system specification.

23. A method for manufacturing a computer module comprising:

providing a substrate;

fabricating redistribution layers having a half-pitch resolution or 2 µm or less on a first side and a second side of the substrate;
mounting a plurality of flip-chip components on each of the first side and the second side of the substrate;
disposing a filler material between the plurality of flip-chip components on each of the first and the second sides of the substrate;
back-grinding and polishing to create a polished planar surface extending across the substrate at the backside of the flip-chip mounted components on each of the first and the second sides of the substrate;
bonding a first metal sheet to the polished planar surface on the first side of the substrate and bonding a second metal sheet to the polished planar surface on the second side of the substrate; and
attaching metal plates to the first metal sheet and the second metal sheet to form a sealed enclosure that is impervious to water except for an opening at a top side of each computer module for making input/output connections.

\* \* \* \* \*